US012183682B2

(12) United States Patent
Chen et al.

(10) Patent No.: US 12,183,682 B2
(45) Date of Patent: Dec. 31, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chien-Hsun Chen, Pingtung County (TW); Chien-Hsun Lee, Hsin-chu County (TW); Chung-Shi Liu, Hsinchu (TW); Jiun-Yi Wu, Taoyuan (TW); Shou-Yi Wang, Hsinchu (TW); Tsung-Ding Wang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 192 days.

(21) Appl. No.: 17/371,110

(22) Filed: Jul. 9, 2021

(65) Prior Publication Data

US 2023/0009901 A1 Jan. 12, 2023

(51) Int. Cl.
*H01L 23/538* (2006.01)
*H01L 23/00* (2006.01)
*H01L 23/498* (2006.01)
*H01L 25/065* (2023.01)

(52) U.S. Cl.
CPC .... *H01L 23/5386* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 24/16* (2013.01); *H01L 25/0655* (2013.01); *H01L 2224/16235* (2013.01); *H01L 2924/1434* (2013.01); *H01L 2924/1811* (2013.01); *H01L 2924/182* (2013.01)

(58) Field of Classification Search
CPC .. H01L 23/5386; H01L 23/50; H01L 23/5383
See application file for complete search history.

(56) References Cited

U.S. PATENT DOCUMENTS 6,483,714 B1 * 11/2002 Kabumoto ........ H01L 23/49838
174/250
9,000,584 B2 4/2015 Lin et al.
9,048,222 B2 6/2015 Hung et al.
9,048,233 B2 6/2015 Wu et al.
(Continued)

*Primary Examiner* — Michele Fan
(74) *Attorney, Agent, or Firm* — JCIPRNET

(57) ABSTRACT

A semiconductor package is provided. The semiconductor package includes: semiconductor dies, separated from one another, and including die I/Os at their active sides; and a redistribution structure, disposed at the active sides of the semiconductor dies and connected to the die I/Os, wherein the redistribution structure includes first and second routing layers sequentially arranged along a direction away from the die I/Os, the first routing layer includes a ground plane and first signal lines laterally surrounded by and isolated from the first ground plane, the first signal lines connect to the die I/Os and rout the die I/Os from a central region to a peripheral region of the redistribution structure, the second routing layer includes second signal lines and ground lines, and the second signal lines and the ground lines respectively extend from a location in the peripheral region to another location in the peripheral region through the central region.

20 Claims, 19 Drawing Sheets

(56) References Cited

U.S. PATENT DOCUMENTS

| | | | |
|---|---|---|---|
| 9,064,879 B2 | 6/2015 | Hung et al. | |
| 9,111,949 B2 | 8/2015 | Yu et al. | |
| 9,123,554 B2* | 9/2015 | Kuroda | H01L 24/09 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0017357 A1* | 1/2005 | Iida | H01L 23/49827 |
| | | | 257/E23.079 |
| 2007/0069834 A1* | 3/2007 | Ikuta | H05K 1/0243 |
| | | | 333/133 |
| 2020/0176368 A1* | 6/2020 | Hoffmeyer | H01L 23/49833 |
| 2023/0005842 A1* | 1/2023 | Kim | H01L 25/18 |

\* cited by examiner

SEMICONDUCTOR PACKAGE AND MANUFACTURING METHOD THEREOF

BACKGROUND

In recent years, the semiconductor industry has experienced rapid growth due to continuous improvement in integration density of various electronic components. In addition, technology development toward heterogeneous system integration is also targeted. A routing layer (RDL) or an interposer is used for realizing interconnection between different semiconductor dies in the same package. As bandwidth of each semiconductor die increases, more ground lines and/or more ground planes are required for suppressing interference between adjacent signal lines. As a result, routing area of the RDL and/or the interposer is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
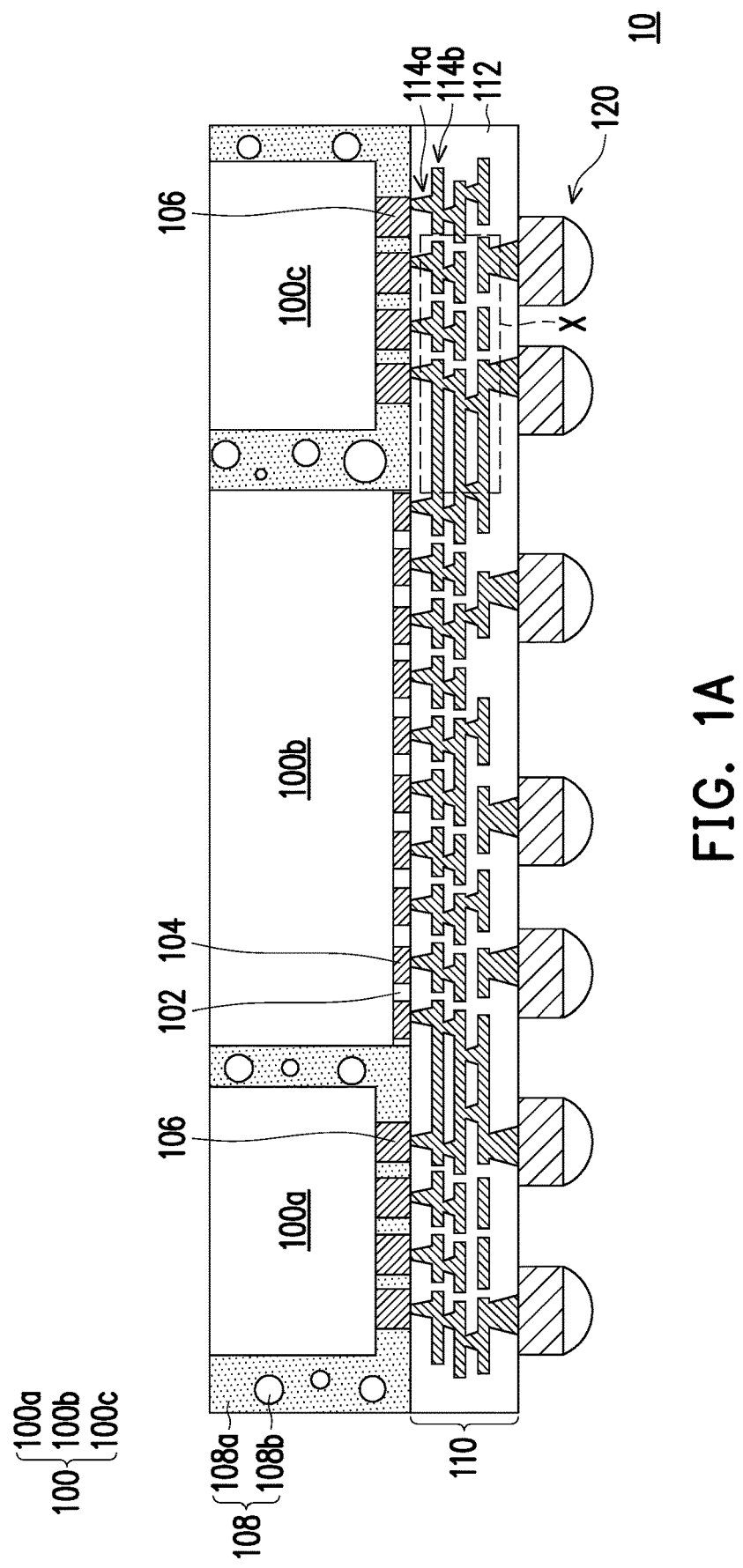
FIG. 1A is a schematic cross-sectional view of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view of a semiconductor package 10 according to some embodiments of the present disclosure.

Referring to FIG. 1A, the semiconductor package 10 according to some embodiments of the present disclosure is an integrated fan-out (InFO) semiconductor package. In these embodiments, multiple semiconductor dies 100 may be encapsulated together, and a redistribution structure 110 is formed at a side of these semiconductor dies 100 for out routing these semiconductor dies 100 and for realizing interconnection between the semiconductor dies 100. For instance, the semiconductor dies 100 include semiconductor dies 100a, 100b, 100c. The semiconductor die 100b may be, for example, a graphic processing unit (GPU) die, while the semiconductor dies 100a, 100c may be, for example, memory dies (e.g., high band width memory (HBM) dies). Further, the semiconductor die 100b may be located between the semiconductor dies 100a, 100c. However, those skilled in the art may modify the amount, types and configuration of the semiconductor dies, the present disclosure is not limited thereto. In some embodiments, the semiconductor die 100b includes a polymer layer 102 and die inputs/outputs (I/Os) 104 at an active side of the semiconductor die 100b. It should be noted that, the active side of a semiconductor die in the present disclosure is referred as a side of a semiconductor substrate at which active devices and interconnections are formed, whereas a back side of a semiconductor die in the present disclosure is referred as a side of the semiconductor substrate facing away from the active devices and the interconnections. The die I/Os 104 may be conductive pillars (e.g., copper pillars), and are laterally surrounded by the polymer layer 102. Similarly, the semiconductor dies 100a, 100c may include die I/Os 106 at their active sides, but may or may not respectively include a polymer layer laterally surrounding the die I/Os 106.

The semiconductor dies 100a, 100b, 100c are encapsulated by an encapsulant 108. In some embodiments, the semiconductor dies 100a, 100b, 100c are laterally surrounded by the encapsulant 108, and the active and back sides of the semiconductor dies 100a, 100b, 100c are not covered by the encapsulant 108. In these embodiments, surfaces of the die I/Os 104, 106 (e.g., bottom surfaces of the die I/Os 104, 106 as shown in FIG. 1A) may be substantially coplanar with a front surface of the encapsulant 108, and the back sides of the semiconductor dies 100a, 100b, 100c may be substantially coplanar with a back surface of the encapsulant 108. Further, in some embodiments, the encapsulant 108 includes a molding compound 108a and filler particles 108b spreading in the molding compound 108a. The molding compound 108a may include a polymer material (e.g., epoxy), and may optionally include curing agent, stress relieving agent, catalyst, the like or combinations thereof. On the other hand, the filler particles 108b may be formed of silica, aluminum oxide, aluminum nitride, the like or combinations thereof. Those skilled in the art may adjust spacings between the semiconductor dies 100a, 100b, 100c according to flowability of the encapsulant 108 and other design requirements, the present disclosure is not limited thereto.

The redistribution structure 110 is formed at the front surface of the encapsulant 108, and covers the die I/Os 104, 106. The redistribution structure 110 is configured to realize interconnections between the semiconductor dies 100a, 100b, 100c, and to out rout the semiconductor dies 100a, 100b, 100c to a greater area. The redistribution structure 110 includes a stack of dielectric layers 112, and includes conductive vias 114a and conductive traces/planes 114b formed in the stack of dielectric layers 112. The conductive traces/planes 114b respectively lie on a surface of one of the dielectric layers 112, whereas the conductive vias 114a respectively penetrate through at least one of the dielectric layers 112 and establish electrical connection with one or more of the conductive traces/planes 114b. As to be further described with reference to FIG. 1B through FIG. 1E, the conductive traces/planes 114b include signal lines, ground lines, ground planes and at least one power plane. The signal lines are configured to transmit signals to/from the semiconductor dies 100a, 100b, 100c. On the other hand, the ground lines and the ground planes are configured to receive a reference voltage (e.g., a ground voltage), whereas the power plane is configured to receive a working voltage (e.g., a direct current (DC) voltage). In the present disclosure, the conductive traces/planes 114b at the same height are described as being located at the same floor in the redistribution structure 110. Even though the redistribution structure 110 is depicted in FIG. 1A as having three floors of the conductive traces/planes 114b, the redistribution structure 110 may actually include four or more floors of the conductive traces/planes 114b (as to be further described with reference to FIG. 1B through FIG. 1E). Those skilled in the art may adjust an amount of the floors in the redistribution structure 110 according to design requirements, the present disclosure is not limited thereto. In some embodiments, a material of the dielectric layers 112 includes a polymer (e.g., polyimide, polybenzoxazole, benzocyclobuten, silicones, acrylates, epoxy or the like), while a material of the conductive vias 114a and the conductive traces/planes 114b includes copper, titanium, nickel, aluminum or the like.

In some embodiments, the semiconductor package 10 further includes electrical connectors 120. The electrical connectors 120 are disposed at a side of the redistribution structure 110 facing away from the encapsulant 108 and the semiconductor dies 100a, 100b, 100c, and may extend into the outermost dielectric layer 112 of the redistribution structure 110 (e.g., the bottommost dielectric layer 112). The electrical connectors 120 are electrically connected to the conductive vias 114a and the conductive traces/planes 114b of the redistribution structure 110, and may be functioned as I/Os of the semiconductor package 10. In some embodiments, the electrical connectors 120 are C4 bumps or micro-bumps. Further, under bump metallization (UBM) layers (not shown) may be optionally formed between the electrical connectors 120 and the redistribution structure 110.

FIG. 1B through FIG. 1E are schematic plane views illustrating multiple floors of the conductive traces/planes 114b in a portion X of the redistribution structure 110 as shown in FIG. 1A. The floors of the conductive traces/planes 114b shown in FIG. 1B through FIG. 1E are referred as routing layers RL1, RL2, RL3, RL4, respectively. The routing layers RL1 is closest to the encapsulated structure (i.e., the structure including the semiconductor dies 100a, 100b, 100c and the encapsulant 108), and the routing layers RL2, RL3, RL4 are each more distant from the encapsulated structure than the former one. In other words, the routing layers RL1, RL2, RL3, RL4 may be regarded as being sequentially arranged along a direction away from the encapsulated structure.

Figure 1B:
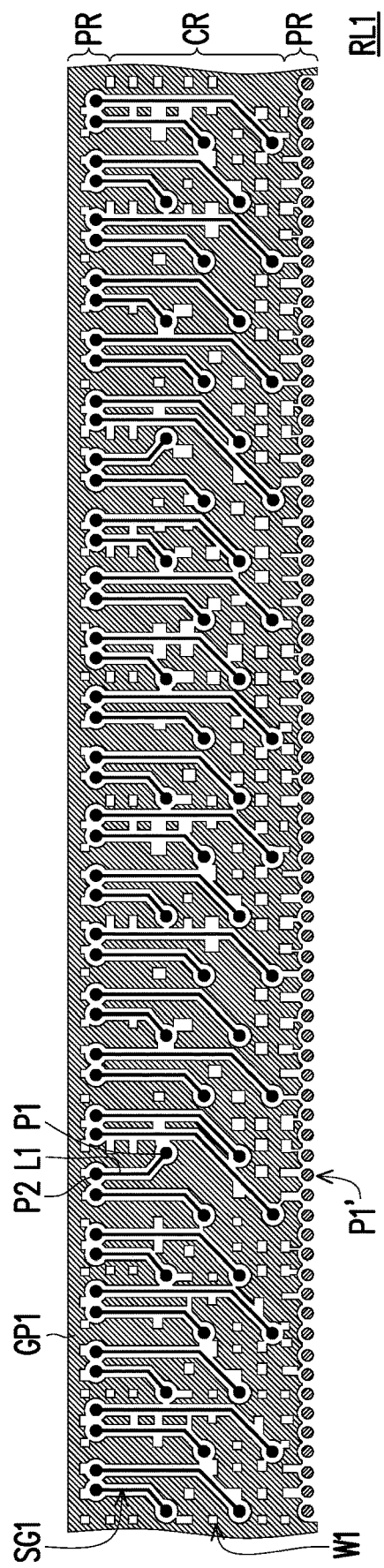
FIG. 1B through FIG. 1E are schematic plane views illustrating multiple floors in a portion X of the redistribution structure as shown in FIG. 1A.

Referring to FIG. 1A and FIG. 1B, the routing layer RL1 includes signal lines SG1 and a ground plane GP1. The signal lines SG1 are located at where the ground plane GP1 is discontinuous, such that the signal lines SG1 are laterally surrounded by the ground plane GP1 and isolated from the ground plane GP1. In addition to having the discontinuous regions, the ground plane GP1 may further include openings W1 for lowering metal density of the semiconductor package 10. Each of the signal lines SG1 may include two pad portions P1, P2 and a line portion L1 connecting the two pad portions P1, P2. The pad portions P1 of the signal lines SG1 are positioned in corresponding to locations of, for example, the die I/Os 106 of the semiconductor die 100c, and may be connected to a top side of the redistribution structure 110 through some of the topmost conductive vias 114a. In some embodiments, the pad portions P1 of the signal lines SG1 are located within a central region CR of the redistribution structure 110. On the other hand, the pad portions P2 of the signal lines SG1 are located in a peripheral region PR of the redistribution structure 110, and may be connected to the underlying routing layer RL2 through some of the conductive vias 114a between the routing layers RL1, RL2. Accordingly, the line portions L1 of the signal lines SG1 extend from the central region CR to the peripheral region PR, and the signal lines SG1 can be regarded as routing, for example, the die I/Os 106 of the semiconductor die 100c from the central region CR to the peripheral region PR of the redistribution structure 110.

Moreover, in some embodiments, the routing layer RL1 further includes additional pads P1' within the peripheral region PR of the redistribution structure 110. The additional pads P1' may not be connected to the signal lines SG1 nor the ground plane GP1. Rather, the additional pads P1' may be connected to other routing layers (e.g., the routing layers RL2, RL3, RL4).

Figure 1C:
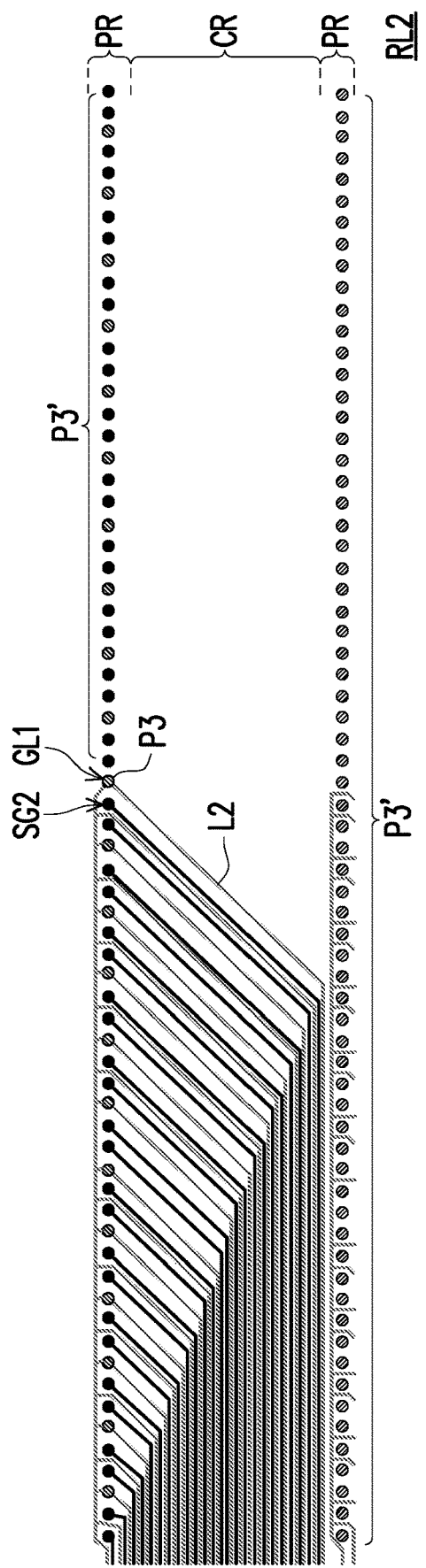
Figure 1D:
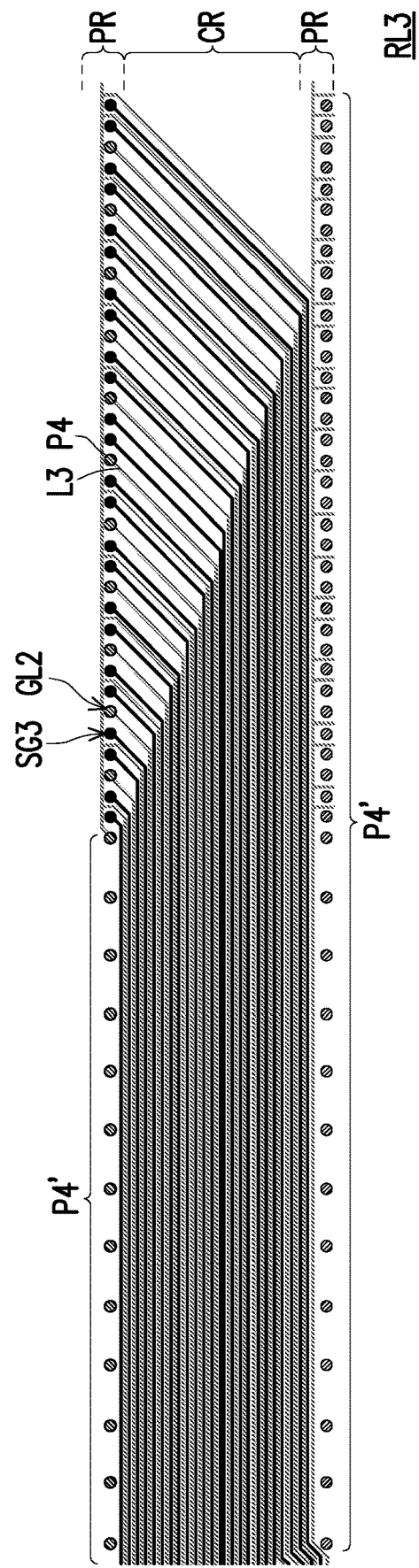
Figure 1E:
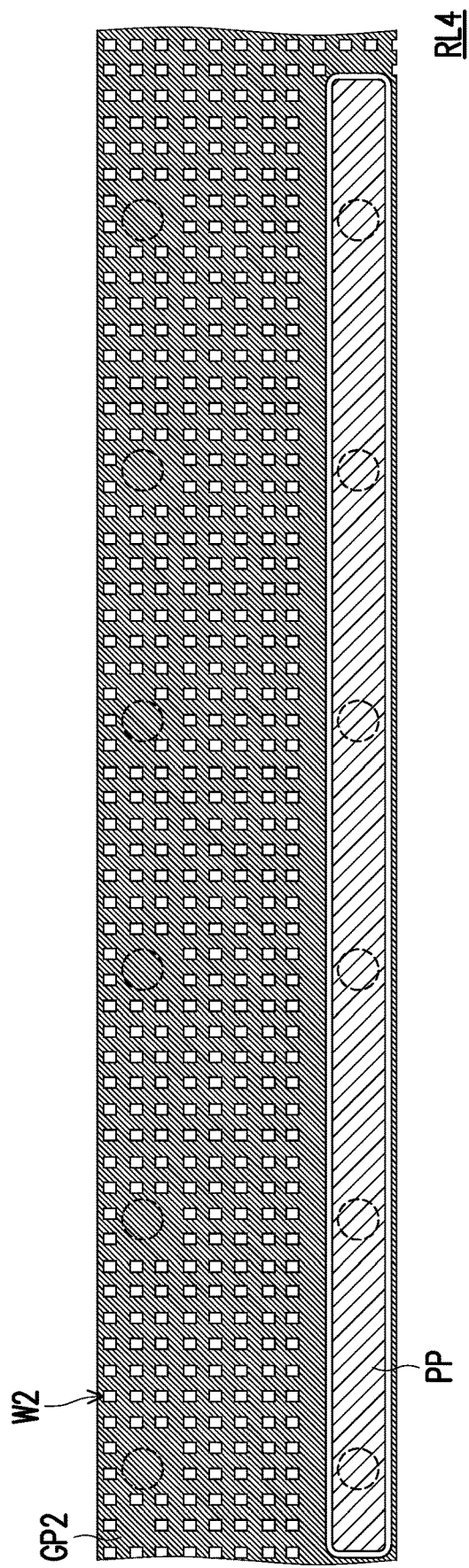

Referring to FIG. 1A, FIG. 1B and FIG. 1C, the routing layer RL2 includes signal lines SG2 and ground lines GL1. The signal lines SG2 and the ground lines GL1 respectively include a pad portion P3 and a line portion L2. The pad portions P3 of the signal lines SG2 are positioned in corresponding to the pad portions P2 of the signal lines SG1 in the routing layer RL1, and are connected to the pad portions P2 of the signal lines SG1 through some of the conductive vias 114a between the routing layers RL1, RL2. In other words, the pad portions P3 of the signal lines SG2 are located within the peripheral region PR of the redistribution structure 110 as well. The line portions L2 of the signal lines SG2 extend from the pad portions P3 connected with, for example, the die I/Os 106 of the semiconductor die 100c through the signal lines SG1 and some of the conductive vias 114a, to other pad portions (not shown) that are connected with, for example, the die I/Os 104 of the semiconductor die 100b and also located in the peripheral region PR of the redistribution structure 110. Accordingly, interconnection between, for example, the semiconductor dies 100b, 100c can be established through the signal lines SG2. In some embodiments, each signal line SG2 has at least one turn along its extending direction. On the other hand, the pad portions P3 of the ground lines GL1 are connected to the ground plane GP1 of the overlying routing layer RL1 through some of the conductive vias 114a between the routing layers RL1, RL2, and are located within the peripheral region PR of the redistribution structure 110. The line portions L2 of the ground lines GL1 extend from the pad portions P3 of the ground lines GL1 to other pad portions (not shown) also within the peripheral region PR of the redistribution structure 110. In some embodiments, the ground lines GL1 are respectively arranged between adjacent ones of the signal lines SG2. In these embodiments, the pad portions P3 of the ground lines GL1 are arranged between the pad portions P3 of the signal lines SG2. In addition, the line portions L2 of the ground lines GL1 may extend between the line portions L2 of adjacent signal lines SG2. By disposing the ground lines GL2 between the signal lines SG2, interference between the signal lines SG2 can be effectively shielded. As an example shown in FIG. 1C, the pad portions P3 of the signal lines SG2 and the ground lines GL1 are arranged in a line in the peripheral region PR of the redistribution structure 110. Each two of the pad portions P3 of the signal lines SG2 may be located between adjacent pad portions P3 of the ground lines GL1. Accordingly, each two of the line portions L2 of the signal lines SG2 may extend between adjacent line portions L2 of the ground lines GL1. However, those skilled in the art may modify the arrangement of the signal line SG2 and the ground lines GL1 according to design requirements, the present disclosure is not limited thereto.

In addition, in some embodiments, the routing layer RL2 may further include additional pads P3' located within the peripheral region PR of the redistribution structure 110. These additional pads P3' may not be in connection with the signal lines SG2 nor the ground lines GL1. Instead, the additional pads P3' may be connected to other components in the routing layer RL2, and/or connected to other routing layers (e.g., the routing layers RL1, RL3, RL4). Moreover, in some embodiments, the routing layer RL2 may further include an additional ground plane and/or a power plane (both not shown) located within an area not occupied by the signal lines SG2 nor the ground lines GL1. The additional ground plane and/or power plane may be connected to other routing layers (e.g., the routing layers RL1, RL3, RL4) through some of the additional pads P3' in the routing layer RL2.

Referring to FIG. 1A through FIG. 1D, the routing layer RL3 includes signal lines SG3 and ground lines GL2. The signal lines SG3 and the ground lines GL2 respectively include a pad portion P4 and a line portion L3. The pad portions P4 of the signal lines SG3 are positioned in corresponding to some of the additional pads P3' of the routing layer RL2 that are arranged aside (e.g., arranged at a right side of) the pad portions P3 of the signal lines SG2 and the ground lines GL1, and are connected to these additional pads P3' through some of the conductive vias 114a between the routing layers RL2, RL3. In other words, the pad portions P4 of the signal lines SG3 are located within the peripheral region PR of the redistribution structure 110, and may not be overlapped with the pad portions P3 of the signal lines SG2 and the ground line GL1 in the routing layer RL2. The line portions L3 of the signal lines SG3 extend from the pad portions P4 connected with, for example, the die I/Os 106 of the semiconductor die 100c, to other pad portions (not shown) that are connected with, for example, the die I/Os 104 of the semiconductor die 100b and also located within the peripheral region PR of the redistribution structure 110. Accordingly, interconnection between, for example, the semiconductor dies 100b, 100c can be established by the signal lines SG2 in the routing layer RL2 and the signal lines SG3 in the routing layer RL3. Therefore, such interconnection between the semiconductor dies (e.g., the semiconductor dies 100b, 100c) can be shared by multiple routing layers (e.g., the routing layers RL2, RL3). As similar to the line portions L2 of the signal lines SG2 in the routing layer RL2, the line portions L3 of the signal lines SG3 in the routing layer RL3 may respectively have at least one turn along their extending directions. On the other hand, the pad portions P4 of the ground lines GL2 are connected to the ground plane GP1 of the routing layer RL1 through some of the conductive vias 114a between the routing layers RL1, RL3 as well as the pad portions P3 of the routing layer RL2, and/or connected to the ground plane GP2 of the routing layer RL4 (to be described with reference to FIG. 1E) through some of the conductive vias 114a between the routing layers RD3, RL4. In addition, the pad portions P4 of the ground lines GL2 are located within the peripheral region PR of the redistribution structure 110. The line portions L3 of the ground lines GL2 extend from the pad portions P4 of the ground lines GL2 to other pad portions (not shown) also within the peripheral region PR of the redistribution structure 110. In some embodiments, the ground lines GL2 are respectively arranged between adjacent ones of the signal lines SG3. In these embodiments, the pad portions P4 of the ground lines GL2 are arranged between the pad portions P4 of the signal lines SG3. In addition, the line portions L3 of the ground lines GL2 may respectively extend between the line portions L3 of adjacent signal lines SG3. By disposing the ground lines GL2 between the signal lines SG3, interference between the signal lines SG3 can be effectively shielded. As an example shown in FIG. 1D, the pad portions P4 of the signal lines SG3 and the ground lines GL2 are arranged in a line within the peripheral region PR of the redistribution structure 110. Each two of the pad portions P4 of the signal lines SG3 may be located between adjacent pad portions P4 of the ground lines GL2. Accordingly, each two of the line portions L3 of the signal lines SG3 may extend between adjacent line portions L3 of the ground lines GL2. However, those skilled in the art may modify the arrangement of the signal line SG3 and the ground lines GL2 according to design requirements, the present disclosure is not limited thereto.

In addition, in some embodiments, the routing layer RL3 may further include additional pads P4' located within the peripheral region PR of the redistribution structure 110. These additional pads P4' may not be in connection with the signal lines SG3 nor the ground lines GL2. Instead, the additional pads P4' may be connected to other components in the routing layer RL3, and/or connected to other routing layers (e.g., the routing layers RL1, RL2, RL4). Moreover, in some embodiments, the routing layer RL3 may further include an additional ground plane and/or a power plane (both not shown) located within an area not occupied by the signal lines SG3 nor the ground lines GL2. The additional ground plane and/or power plane may be connected to other routing layers (e.g., the routing layers RL1, RL2, RL4) through some of the additional pads P4' in the routing layer RL3.

Referring to FIG. 1A through FIG. 1E, the routing layer RL4 includes a ground plane GP2 and a power plane PP. The ground plane GP2 may be connected to the ground lines GL2 and the additional ground plane (if any) in the routing layer RL3, the ground lines GL1 and the additional ground plane (if any) in the routing layer RL2, and the ground plane GP1 in the routing layer RL1, whereas the power plane PP may be connected to the power plane(s) (if any) in the routing layers RL2, RL3. The power plane PP may be located at where the ground plane GP2 is discontinuous, thus can be laterally surrounded and isolated from the ground plane GP2. In addition to having the discontinuous regions, the ground plane GP2 may further include openings W2 for lowering metal density of the semiconductor package 10. Moreover, it should be noted that, circles depicted in dash lines indicate locations where the electrical connectors 120 as shown in FIG. 1A may be disposed.

As described above, the signal lines SG1 in the routing layer RL1 that is closest to the semiconductor dies 100a, 100b, 100c are configured to rout the die I/Os 104, 106 from the central region CR to the peripheral region PR of the redistribution structure 110. Therefore, the pad portions P3 (i.e., terminal portions) of the signal lines SG2 and the ground lines GL1 in the routing layer RL2 lying under the routing layer RL1 can be disposed in the peripheral region PR of the redistribution structure 110, rather than the central region CR of the redistribution structure 110. As a result, more area in the central region CR of the redistribution structure 110 can be provided for the line portions L2 of the signal lines SG2 and the ground lines GL1. In other words, the signal lines SG2 and the ground lines GL1 can be considered as having a larger routing area in the central region CR of the redistribution structure 110. Since the signal lines SG2 and the ground lines GL1 have larger routing area, pitch and/or line width of the signal lines SG2 and the ground lines GL1 can be effectively increased. Consequently, the signal lines SG2 and the ground lines GL1 can be less susceptible to stress induced during manufacturing process.

Figure 1F:
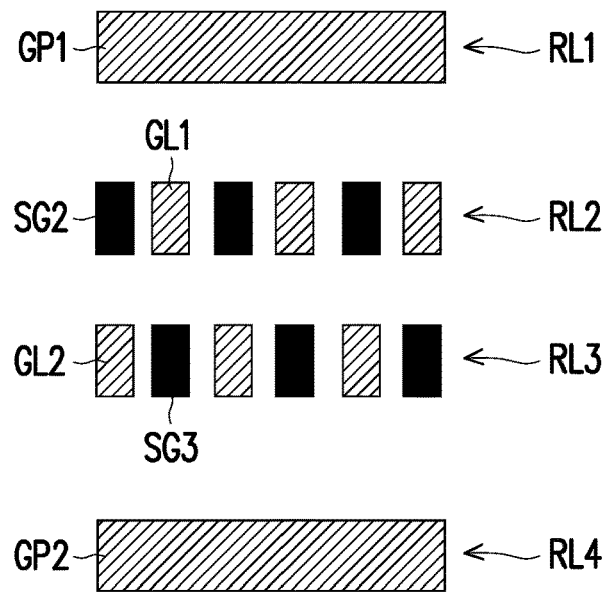
FIG. 1F is a schematic cross-sectional view illustrating the routing layers in the redistribution structure according to some embodiments of the present disclosure.

FIG. 1F is a schematic cross-sectional view illustrating the routing layers RL1, RL2, RL3, RL4 according to some embodiments of the present disclosure. It should be noted that, only portions of the routing layers RL1, RL2, RL3, RL4 are schematically depicted in FIG. 1F.

Referring to FIG. 1F, in some embodiments, each of the signal lines SG2 in the routing layer RL2 is provided with electromagnetic shield by the laterally adjacent ground lines GL1 at opposite sides, the overlying ground plane GP1 in the routing layer RL1 and an underlying ground line GL2 in the routing layer RL3. In this way, four sides (e.g., top, bottom, right and left sides) of each signal line SG2 in the routing layer RL2 are electromagnetically shielded. Similarly, each of the signal lines SG3 in the routing layer RL3 may be provided with electromagnetic shield by the laterally adjacent ground lines GL2 at opposite sides, an overlying ground line GL1 in the routing layer RL2 and the underlying ground plane GP2 in the routing layer RL4. Accordingly, four sides of each signal line SG3 in the routing layer RL3 are electromagnetically shielded as well.

Figure 2:
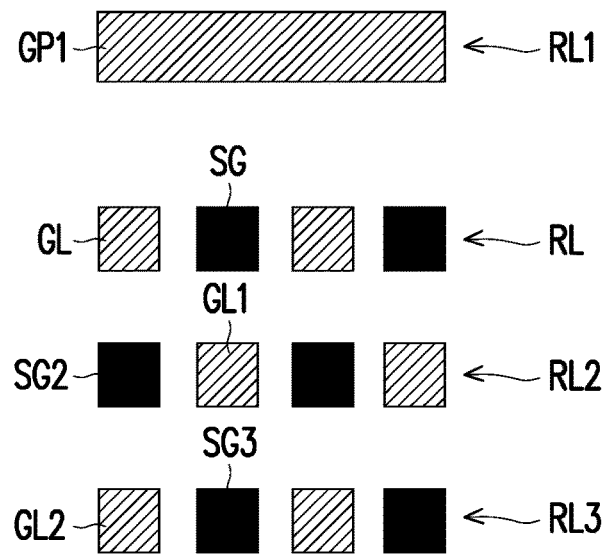
FIG. 2 is a schematic cross-sectional view illustrating the routing layers in the redistribution structure according to alternative embodiments of the present disclosure.

FIG. 2 is a schematic cross-sectional view illustrating the routing layers according to alternative embodiments of the present disclosure. It should be noted that, only portions of the routing layers are schematically depicted in FIG. 2.

Referring to FIG. 1F and FIG. 2, difference between the redistribution structure 110' shown in FIG. 2 and the redistribution structure 110 shown in FIG. 1F mainly lies in that the redistribution structure 110' shown in FIG. 2 further includes an additional routing layer RL. The additional routing layer RL is similar to the routing layer RL2 or the routing layer RL3, and as well includes signal lines and ground lines (labeled as signal lines SG and ground lines GL). As depicted in FIG. 2, in some embodiments, the additional routing layer RL is inserted between the routing layers RL1, RL2. However, the additional routing layer RL may be alternatively inserted between the routing layers RL2, RL3, or between the routing layers RL3, RL4. As described with reference to FIG. 1F, four sides of each signal line in the routing layers RL, RL2, RL3 may be electromagnetically shielded, and such electromagnetic shield can be provided by the ground lines GL, GL1, GL2 and the ground planes GP1, GP2.

Figure 3:
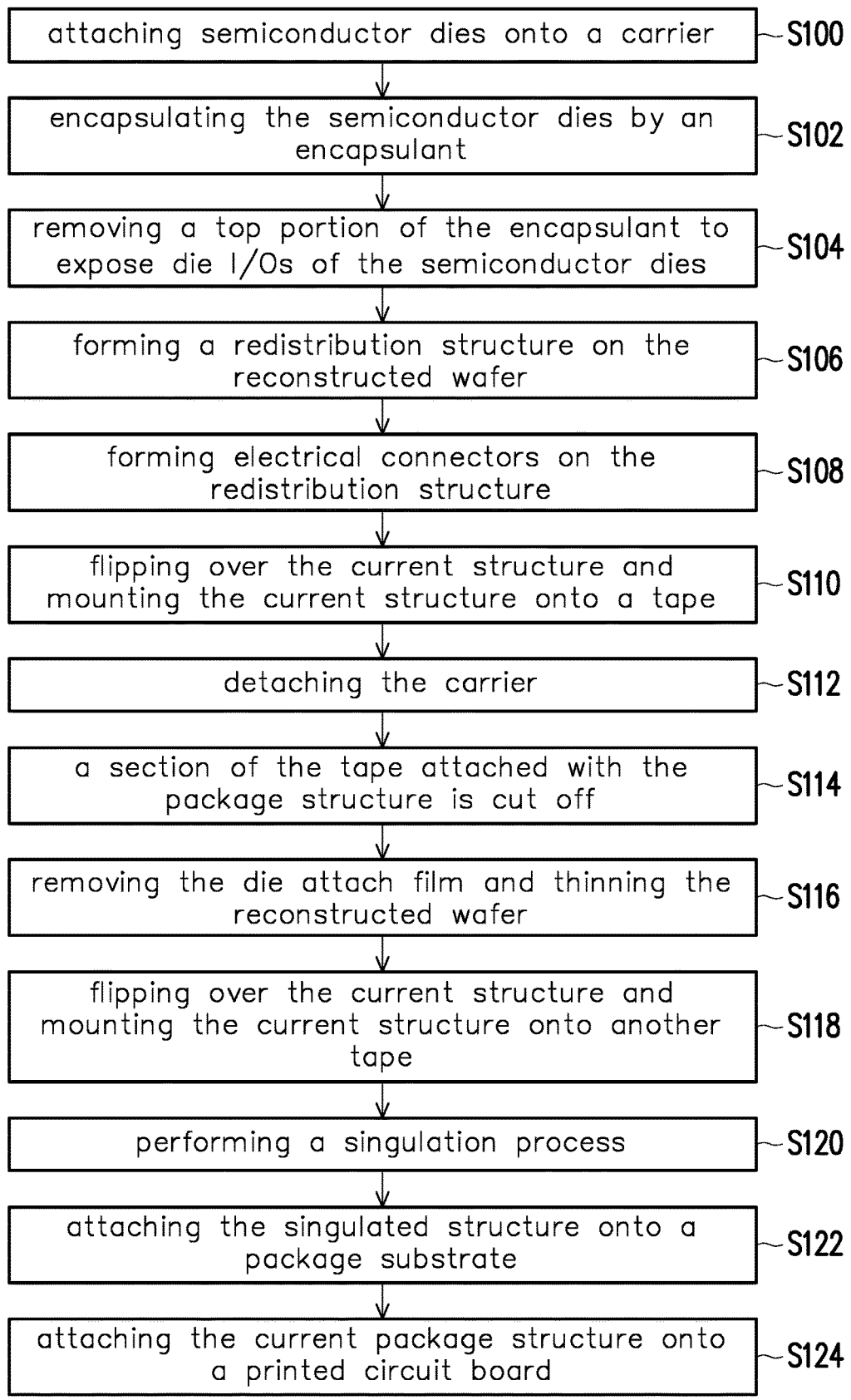
FIG. 3 is a flow diagram illustrating a manufacturing method of a semiconductor package according to some embodiments of the present disclosure.

FIG. 3 is a flow diagram illustrating a manufacturing method of a semiconductor package 20 according to some embodiments of the present disclosure. FIG. 4A through FIG. 4K are cross-sectional views illustrating structures at various stages during the manufacturing process as shown in FIG. 3. It should be noted that, the semiconductor package 10 shown in FIG. 1A is a semi-finished structure of the manufacturing process, and is shown in FIG. 4J.

Figure 4A:
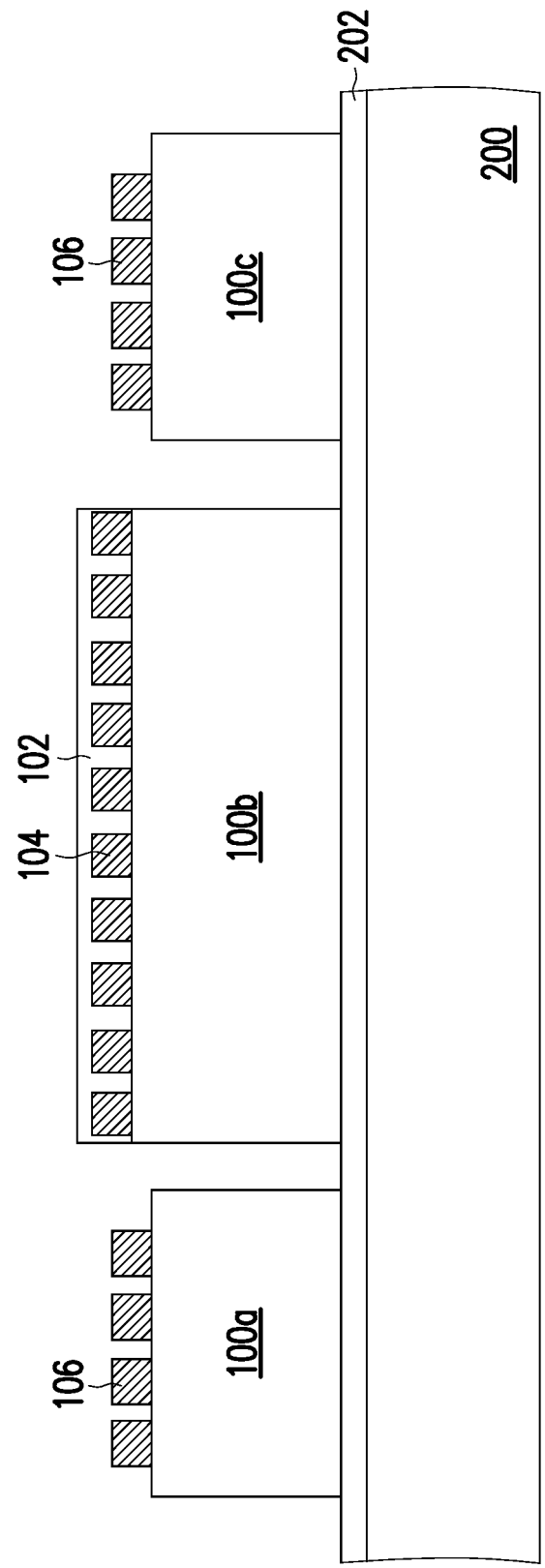
FIG. 4A through FIG. 4K are cross-sectional views illustrating structures at various stages during the manufacturing process as shown in FIG. 3.

Referring to FIG. 3 and FIG. 4A, step S100 is performed, and the semiconductor dies 100a, 100b, 100c are attached on a carrier 200, such as a glass carrier. In some embodiments, the back sides of the semiconductor dies 100a, 100b, 100c are attached to the carrier 200, while the active sides of the semiconductor dies 100a, 100b, 100c face away from the carrier 200. The polymer layer 102 and the die I/Os 104 are disposed at the active side of the semiconductor die 100b, whereas the die I/Os 106 are disposed at the active side of the semiconductor dies 100a, 100c. Currently, top surfaces of the die I/Os 104 are covered by the polymer layer 102, and a top surface of the polymer layer 102 as well as the top surfaces of the die I/Os 104 at the active side of the semiconductor die 100b may be higher than top surfaces of the die I/Os 106 at the active sides of the semiconductor dies 100a, 100c. A method for attaching the semiconductor dies 100a, 100b, 100c onto the carrier 200 may include a pick-and-place (PNP) process. In some embodiments, an adhesive layer (not shown) and a die attach film 202 may be sequentially disposed on a surface of the carrier 200 before the semiconductor dies 100a, 100b, 100c are attached on this surface of the carrier 200. The adhesive layer 102 is, for example, a light-to-heat conversion (LTHC) layer or a thermal release layer.

Figure 4B:
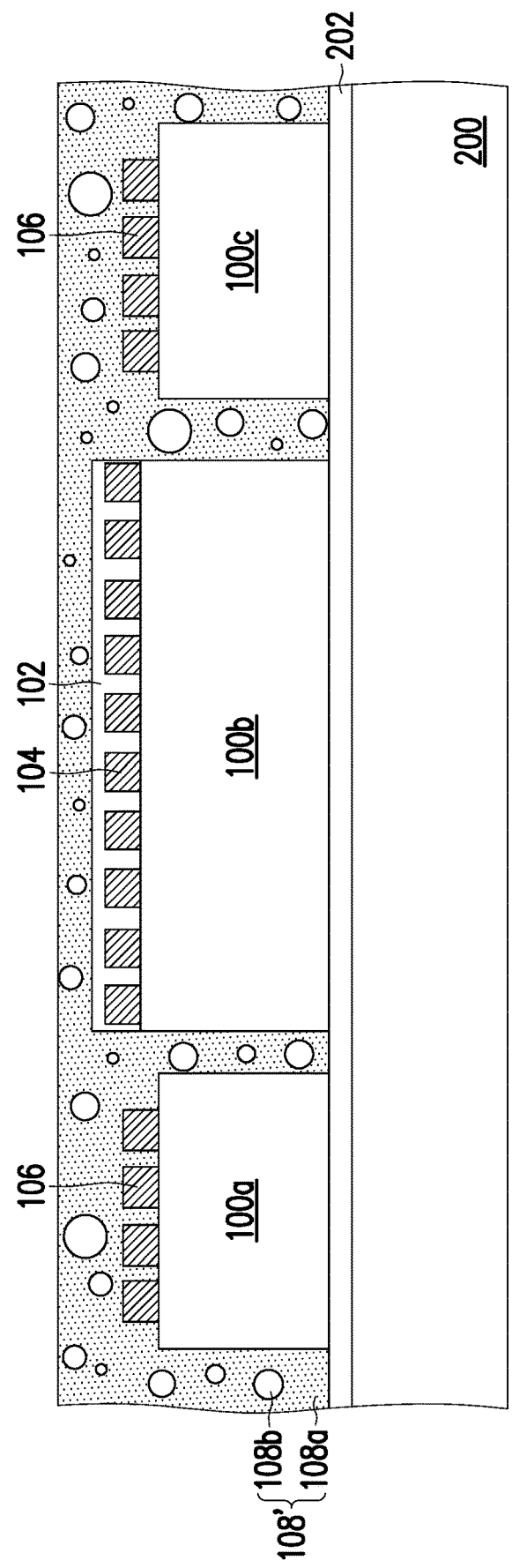

Referring to FIG. 2 and FIG. 4B, step S102 is performed, and the semiconductor dies 100a, 100b, 100c are encapsulated by an encapsulant 108'. The encapsulant 108' may be further thinned to form the encapsulant 108 as shown in FIG. 1A. Currently, the semiconductor dies 100a, 100b, 100c may be over-molded by the encapsulant 108'. In other words, in addition to laterally surrounding the semiconductor dies 100a, 100b, 100c, the encapsulant 108' may further cover the top surface of the polymer layer 102 at the active side of the semiconductor die 100b and the top surfaces of the die I/Os 106 at the active sides of the semiconductor dies 100a, 100c.

Figure 4C:
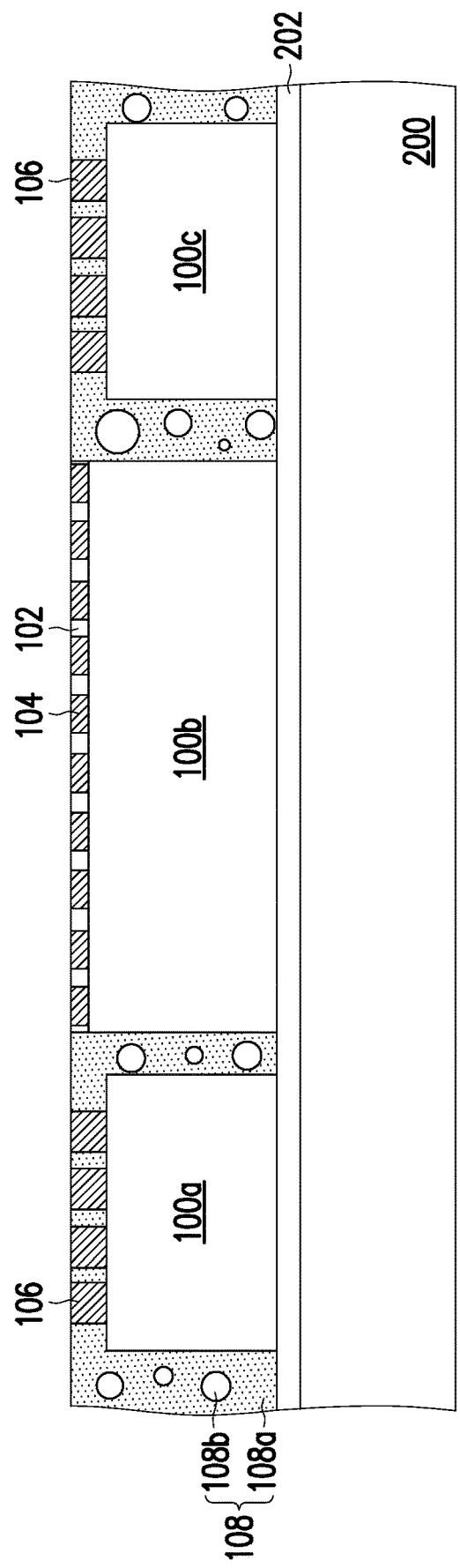

Referring to FIG. 2 and FIG. 4C, step S104 is performed, and a top portion of the encapsulant 108' is removed to expose the die I/Os 104, 106 of the semiconductor dies 100a, 100b, 100c. Thereby, the encapsulant 108' is thinned to form the encapsulant 108. In addition, during removal of the top portion of the encapsulant 108', a top portion of the polymer layer 102 and top portions of the die I/Os 104 may be removed as well. As a result, the top surface of the polymer layer 102 and the top surfaces of the die I/Os 104 may currently be leveled with the top surfaces of the die I/Os 106 of the semiconductor dies 100a, 100c.

Figure 4D:
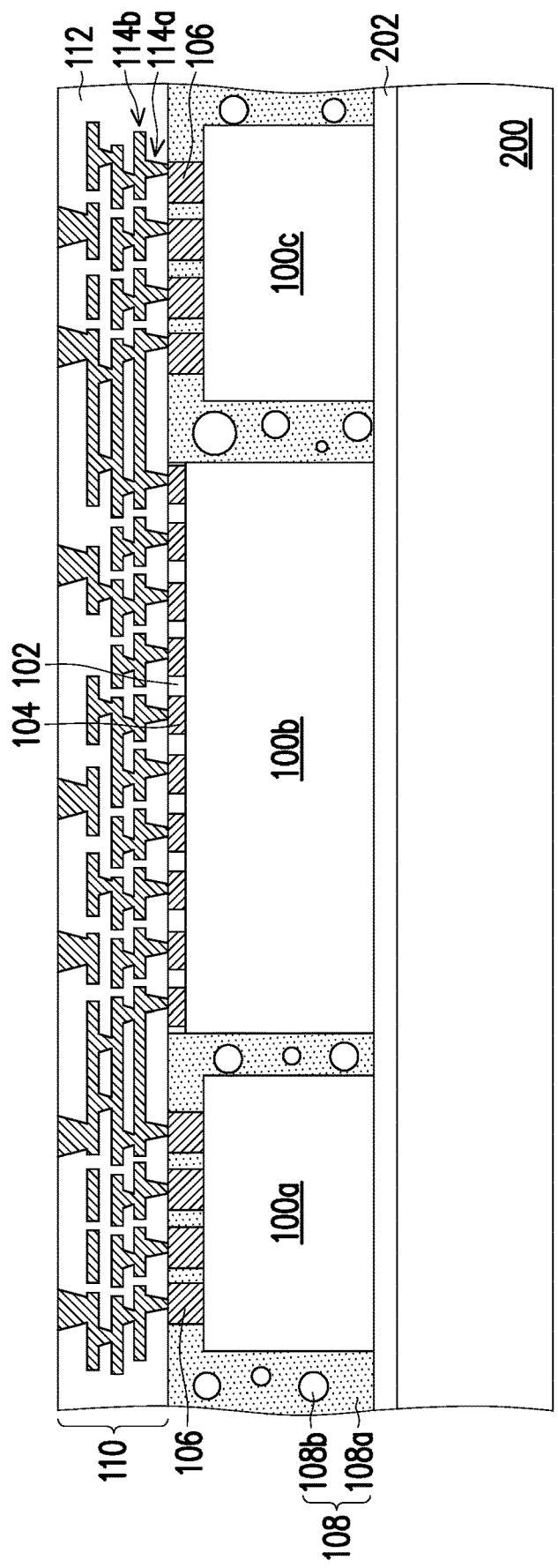

Referring to FIG. 2 and FIG. 4D, step S106 is performed, and the redistribution structure 110 is formed on the reconstructed wafer including the semiconductor dies 100a, 100b, 100c and the encapsulant 108. As described with reference to FIG. 1A, the redistribution structure 110 includes the stack of dielectric layers 112, and includes conductive vias 114a and conductive traces/planes 114b formed in the stack of dielectric layers 112. In some embodiments, a method for forming one of the dielectric layers 112, the conductive via(s) 114a in this dielectric layer 112 and the conductive trace(s)/plane(s) 114b on the dielectric layer 112 includes deposition of this dielectric layer 112, and forming through hole(s) in this dielectric layer 112 for defining the location(s) of the conductive via(s) 114a. Subsequently, a photoresist pattern (not shown) having opening(s) for defining location(s) of the conductive trace(s)/plane(s) 114b is formed on this dielectric layer, and a conductive material is filled into these through hole(s) and opening(s) to form these conductive via(s) 114a and conductive trace(s)/plane(s) 114b. Afterwards, the photoresist pattern is removed by, for example, an ashing process or a stripping process. Such method may be repeated multiple times for forming the redistribution structure 110.

Figure 4E:
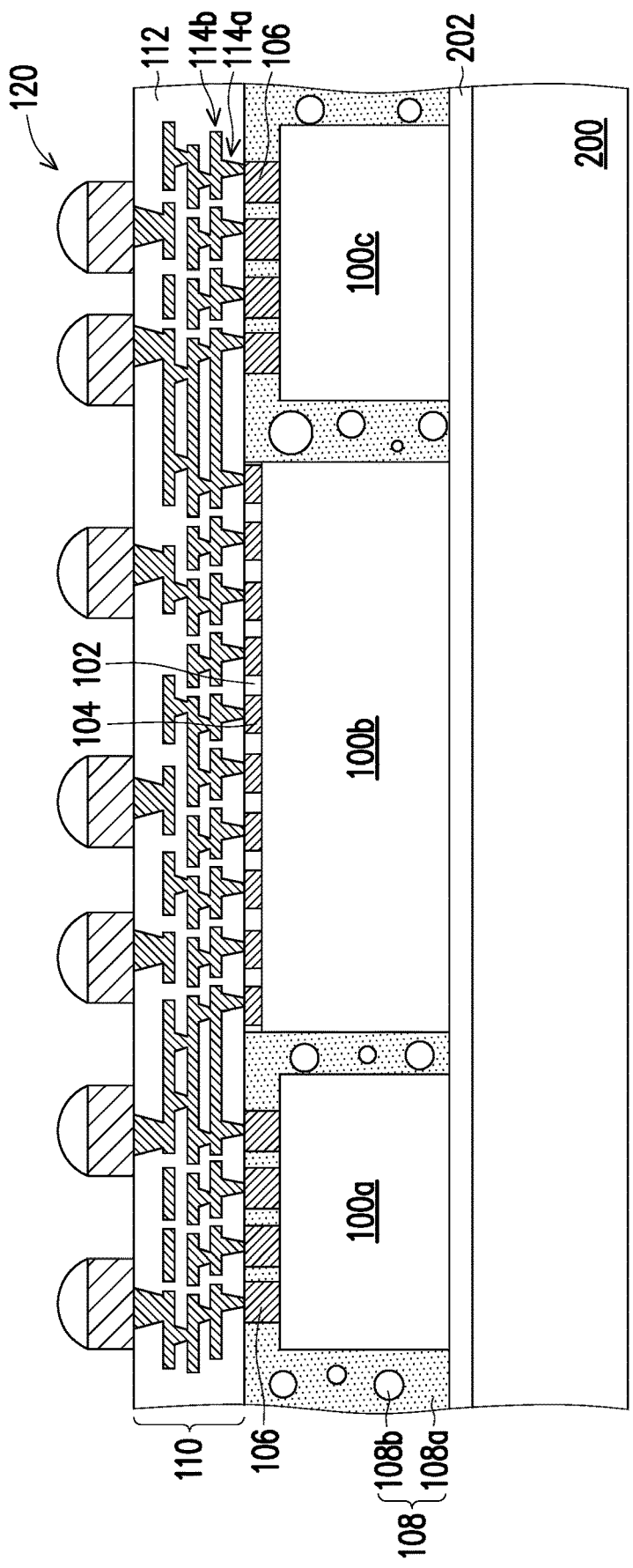

Referring to FIG. 2 and FIG. 4E, step S108 is performed, and the electrical connectors 120 are formed on the redistribution structure 110. Those skilled in the art may select an appropriate method for forming the electrical connectors 120 according to types of the electrical connectors 120, the present disclosure is not limited thereto. In addition, UBM layers (not shown) may be optionally formed between the electrical connectors 120 and the redistribution structure 110.

Figure 4F:
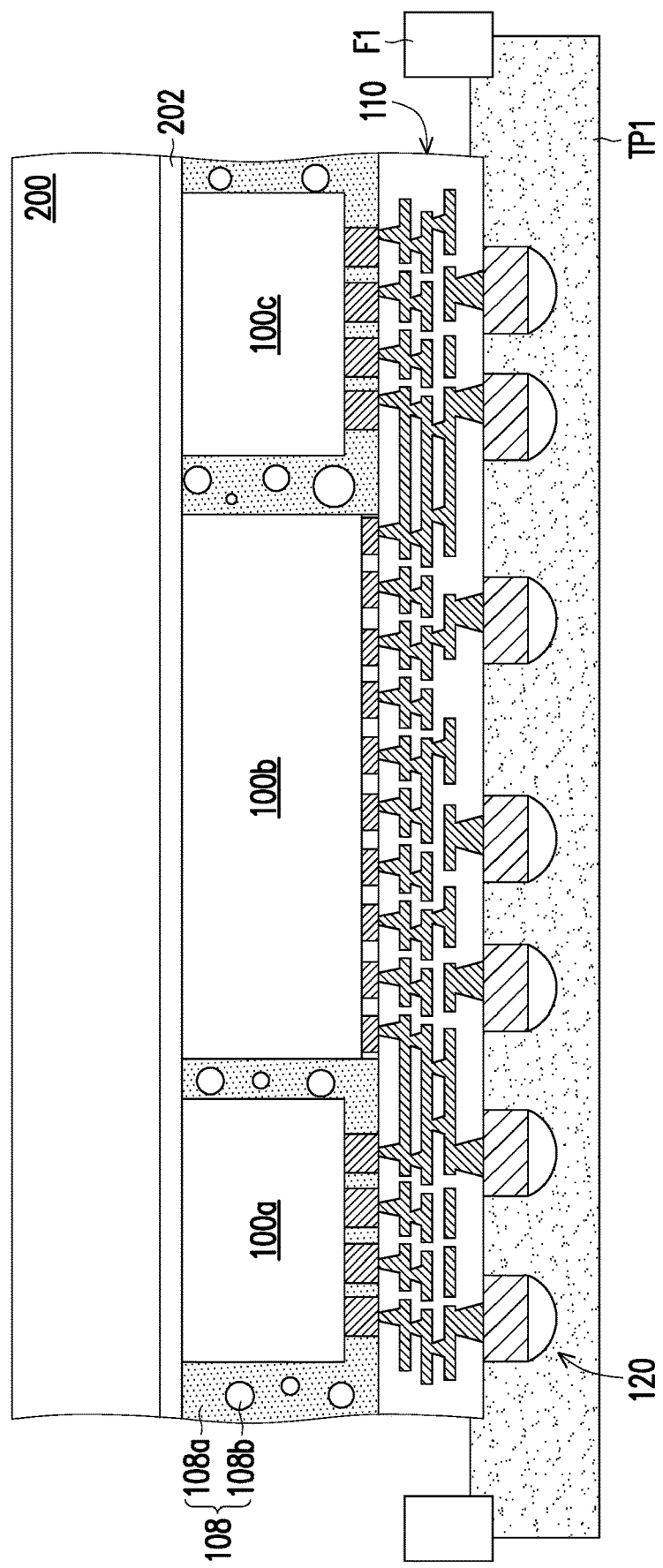

Referring to FIG. 2 and FIG. 4F, step S110 is performed, and the current structure is flipped over and mounted onto a tape TP1. Accordingly, the tape TP1 is attached with the electrical connectors 120, and may be further attached with the outermost surface of the redistribution structure 110 (e.g., the bottommost surface of the redistribution structure 110 as shown in FIG. 4F). In some embodiments, the tape TP is fixed to a frame F1.

Figure 4G:
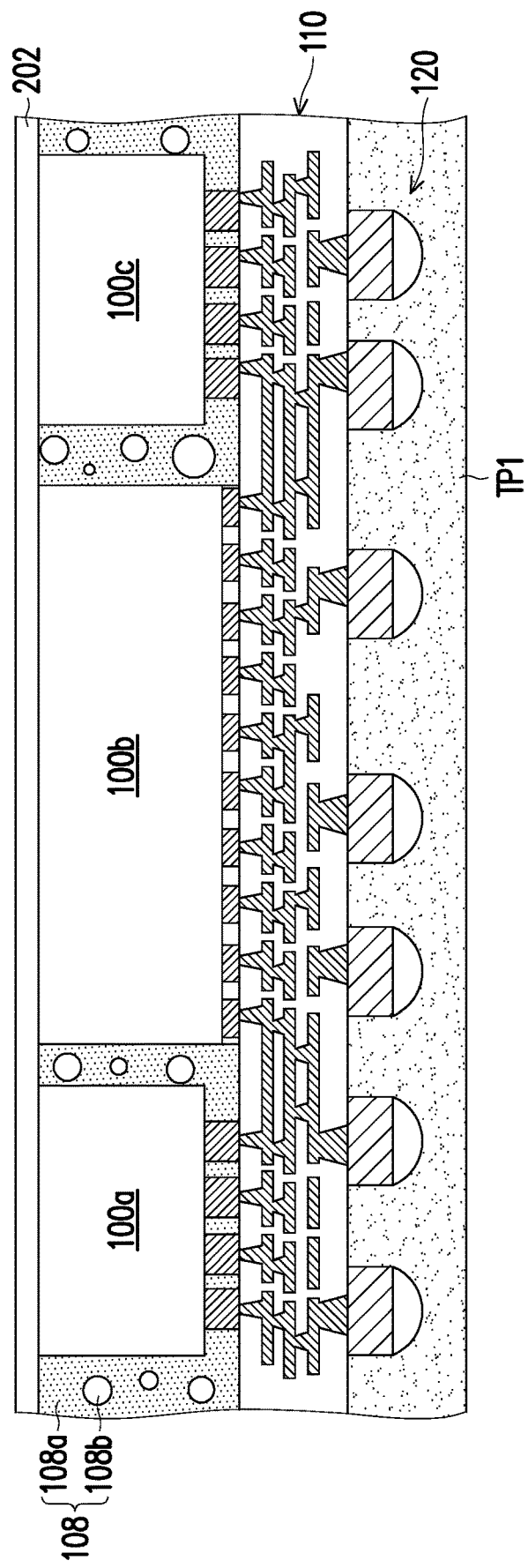

Referring to FIG. 2 and FIG. 4G, step S112 is performed, and the carrier 200 is detached. In those embodiments where the adhesive layer (not shown) is a LTHC release layer or a thermal release layer, the adhesive layer loses its adhesiveness while being exposed to light or heat. Once the adhesive layer loses its adhesiveness, the carrier 200 as well as the adhesive layer can be detached from the die attach film 202, and the die attach film 202 may be exposed.

Subsequently, step S114 is performed, and a section of the tape TP1 attached with the package structure is cut off. Accordingly, this section of the tape TP1 along with the package structure attached thereof are disconnected from the frame F1 shown in FIG. 4G for further processes.

Figure 4H:
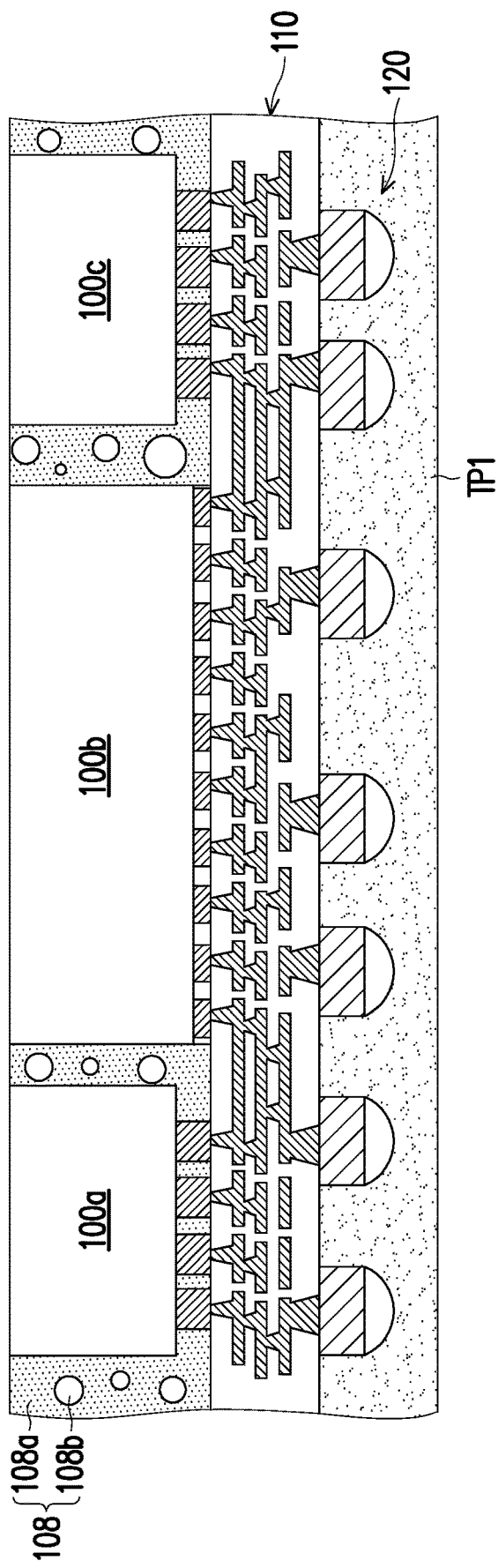

Referring to FIG. 2 and FIG. 4H, step S116 is performed, such that the die attach film 202 is removed, and the reconstructed wafer including the semiconductor dies 100a, 100b, 100c and the encapsulant 108 is thinned (not shown). The die attach film 202 may be ripped or stripped off from the reconstructed wafer, so as to expose a back side of the reconstructed wafer. Subsequently, a thinning process is performed on the exposed back side of the reconstructed wafer. During the thinning process, a thickness of the reconstructed wafer is reduced. In some embodiments, the thinning process includes a grinding process. Alternatively, the die attach film 202 may be removed during the thinning process.

Figure 4I:
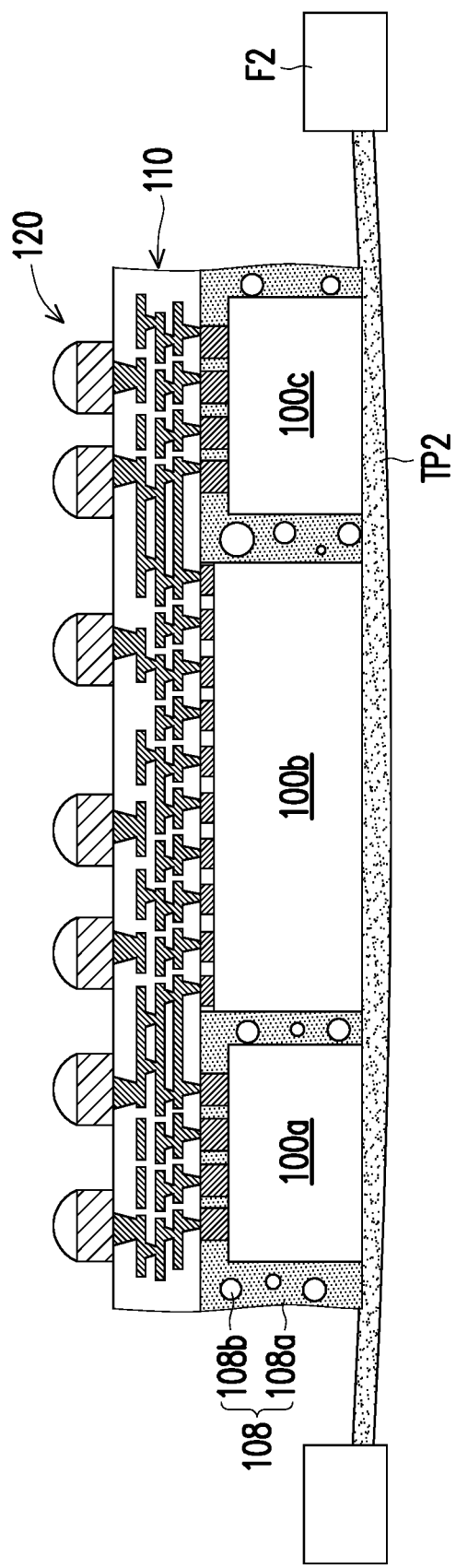
Figure 4J:
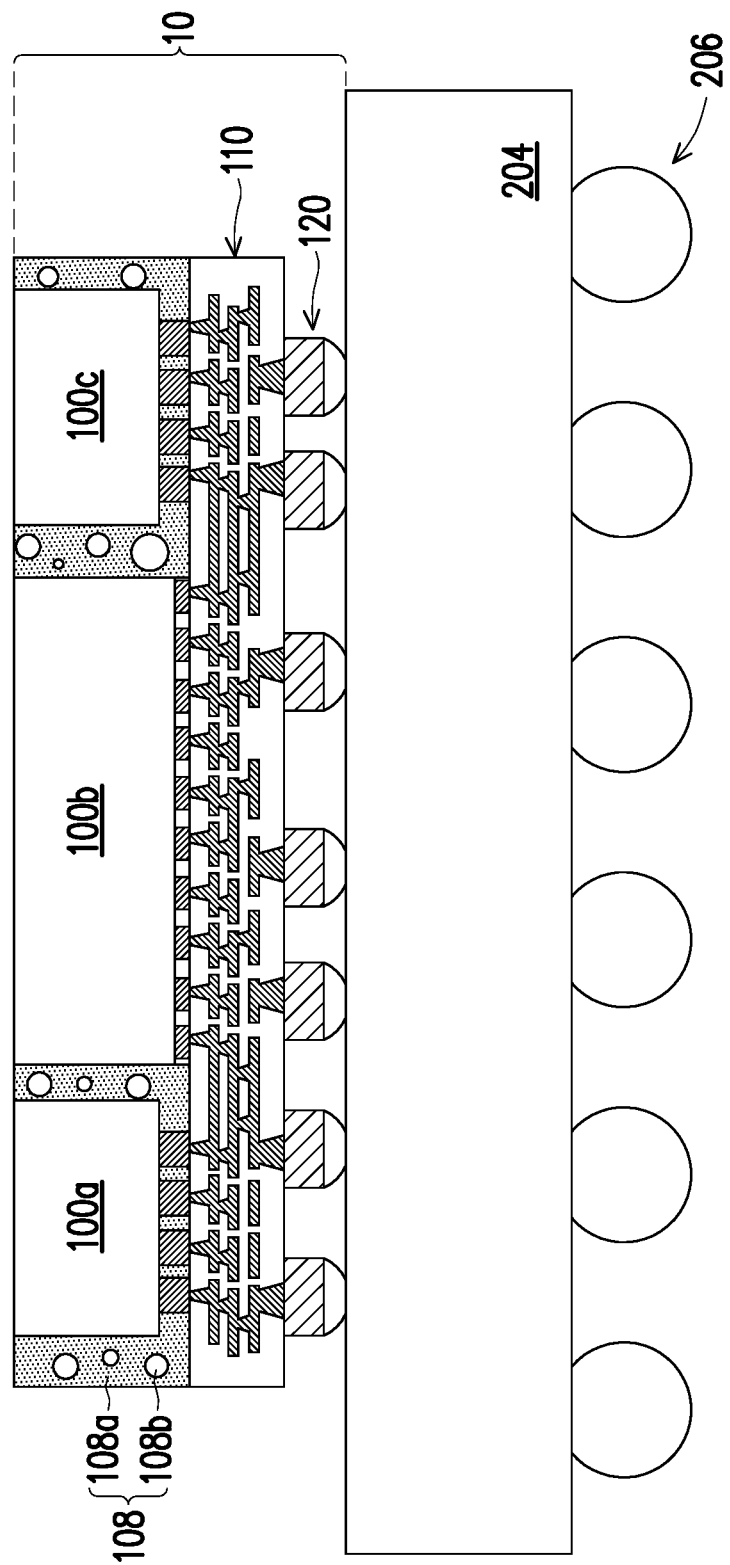

Referring to FIG. 2 and FIG. 4I, step S118 is performed, such that the current structure is flipped over and mounted to another tape TP2, and the tape TP1 is removed. Accordingly, the tape TP2 is attached with the back sides of the semiconductor dies 100a, 100b, 100c and the back surface of the encapsulant 108. On the other hand, the electrical connectors 120 and the outermost surface of the redistribution structure 110 (e.g., the top surface of the redistribution structure 110 as shown in FIG. 4I) are exposed. In some embodiments, the tape TP2 is fixed to a frame F2.

Afterward, step S120 is performed, and a singulation process is performed on the current package structure. The semiconductor package 10 as shown in FIG. 1A maybe one of the singulated structures. After the singulation process, the tape TP2 may be detached from the semiconductor package 10. In some embodiments, the singulation process includes a sawing process, a plasma dicing process or the like.

Referring to FIG. 2 and FIG. 4J, step S122 is performed, and the semiconductor package 10 is attached on a package substrate 204. In some embodiments, although not shown, the package substrate 204 includes a dielectric core, and includes patterned dielectric layers and patterned circuit layers stacked on a single side or opposite sides of the dielectric core. In alternative embodiments, the package substrate 204 is a core-less package substrate, and merely includes the stack of patterned dielectric layers and the patterned circuit layers. The circuit layers are configured to rout the signals from the electrical connectors 120 to electrical connectors 206 disposed at a side of the package substrate 204 facing away from the semiconductor package 10. In those embodiments where the electrical connectors 120 are C4 bumps, the electrical connectors 206 may be BGA balls.

Figure 4K:
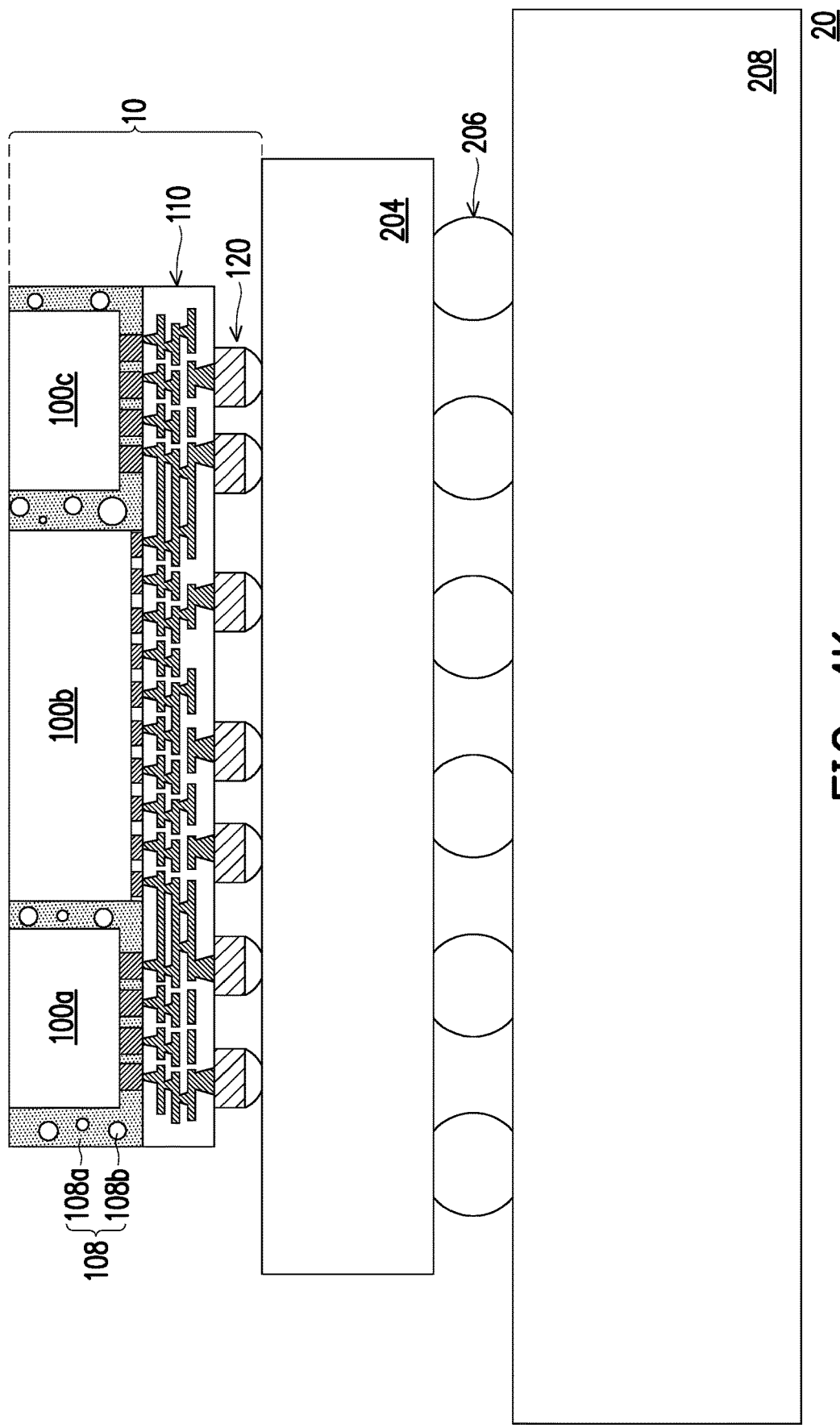

Referring to FIG. 2 and FIG. 4K, step S124 is performed, and the current package is attached on a printed circuit board (PCB) 208. As shown in FIG. 4K, the PCB 208 is attached with the electrical connectors 206 of the package substrate 204, thus the package substrate 204 is located between the semiconductor package 10 and the PCB 208. Up to here, a semiconductor package 20 has been formed according to some embodiments of the present disclosure. Although not shown, the semiconductor package 20 may be subjected to further packaging process and/or testing procedures.

Figure 5:
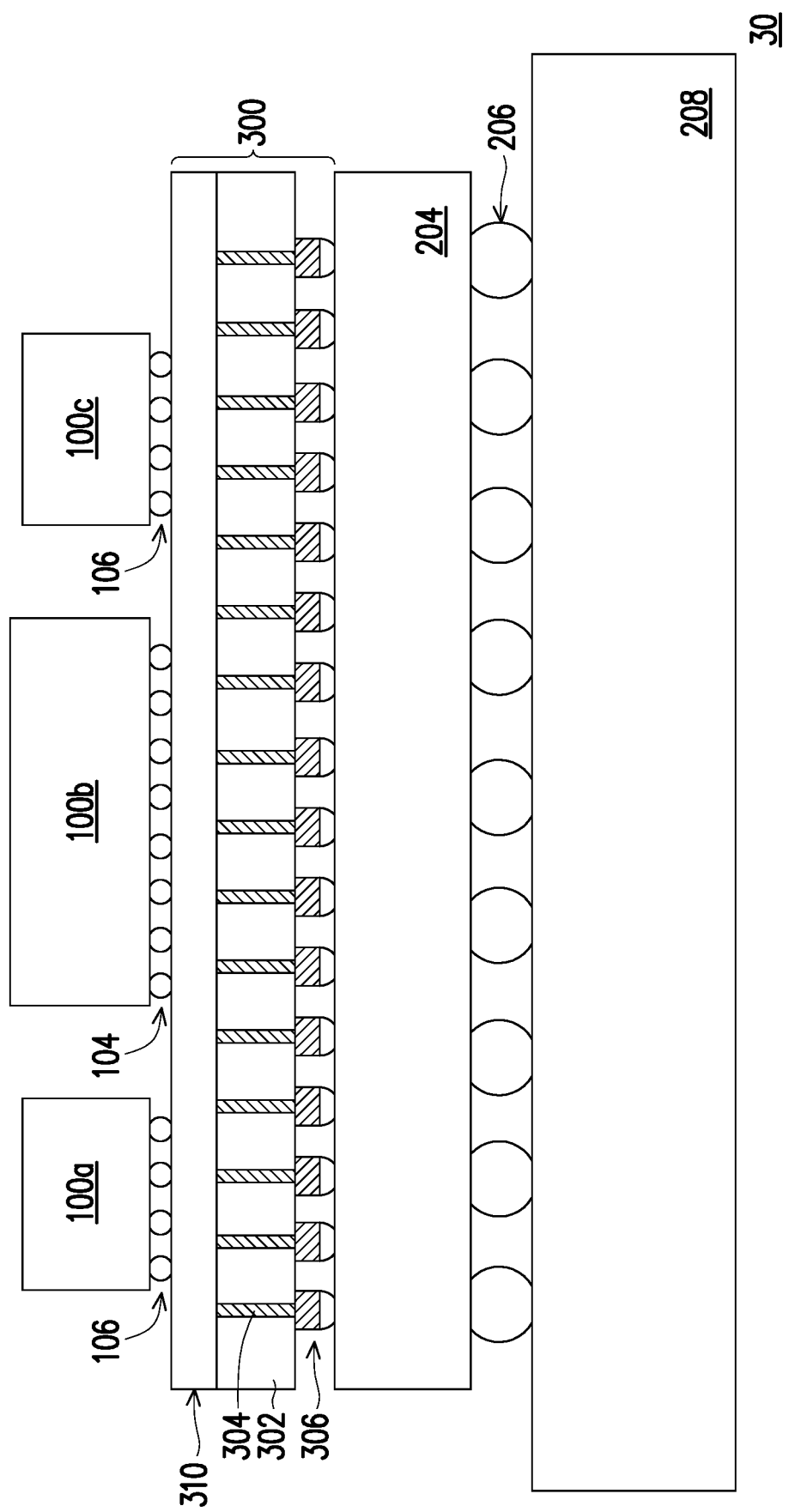
FIG. 5 is a cross-sectional view of a semiconductor package according to some alternative embodiments of the present disclosure.

FIG. 5 is a cross-sectional view of a semiconductor package 30 according to some alternative embodiments of the present disclosure. The semiconductor package 30 shown in FIG. 5 is similar to the semiconductor package 20 as shown in FIG. 4K. Only differences therebetween will be described, the same or the like parts would not be repeated again.

Referring to FIG. 5, in some embodiments, the semiconductor package 30 is a 2.5D semiconductor package. In these embodiments, the semiconductor package 30 further includes an interposer 300, and the semiconductor dies 100a, 100b, 100c are electrically connected to the interposer 300 without a redistribution structure (e.g., the redistribution structure 110 as shown in FIG. 1A) in between. Conductive vias and conductive traces for routing and interconnecting the semiconductor dies 100a, 100b, 100c (e.g., the conductive vias 114a and the conductive traces/planes 114b shown in FIG. 1A) are formed in an interconnection structure 310 of the interposer 300. The interposer 300 may include a substrate 302 and the interconnection structure 310 formed on the substrate 302. Although not shown, the interconnection structure 302 includes a stack of dielectric layers, and includes conductive vias and conductive traces/planes spreading in the stack of dielectric layers, as similar to the redistribution structure 110 shown in FIG. 1A. The conductive traces/planes in the interconnection structure 310 may spread in multiple floors, and may include signal lines, ground lines, ground planes and power planes as described with reference to FIG. 1B through FIG. 1E. Further, configurations of the floors of conductive traces/planes in the interconnection structure 310 may be identical or similar to the configurations of the routing layers RL1, RL2, RL3, RL4 as shown in FIG. 1B through FIG. 1E. In other words, the signal lines in the interconnection structure 310 that are closest to the semiconductor dies 100a, 100b, 100c are configured to rout the die I/Os 104, 106 of the semiconductor dies 100a, 100b, 100c from a central region to a peripheral region of the interconnection structure 310. Therefore, pad portions of the signal lines and ground lines relatively distant from the semiconductor dies 100a, 100b, 100c can be disposed in the peripheral region of the interconnection structure 310. As a result, more area in the central region of the interconnection structure 110 can be provided for line portions of these signal lines and ground lines. In some embodiments, the substrate 302 is a semiconductor substrate or a semiconductor-on-insulator (SOI) substrate, and a semiconductor material of the substrate 302 may include, for example, silicon. In addition, in some embodiments, the dielectric layers in the interconnection structure 310 are made of silicon oxide, silicon nitride, silicon oxynitride or the like, while the conductive vias and the conductive traces/planes are made of copper, titanium, nickel, aluminum or the like. In these embodiments, the interconnection structure 310 may be formed by a back-end-of-line (BEOL) manufacturing process. Moreover, in some embodiments, the die I/Os 104, 106 of the semiconductor dies 100a, 100b, 100c may be micro-bumps.

In addition, the interposer 300 may further include through substrate vias (TSVs) 304. The TSVs 304 penetrate through the substrate 302, and are configured to rout the conductive vias and the conductive traces/planes in the interconnection structure 310 to a bottom side of the substrate 302. Further, electrical connectors 306 may be disposed at the bottom surface of the substrate 302. The electrical connectors 306 are electrically connected to the TSVs 304, and may be attached to the package substrate 204. In some embodiments, the electrical connectors 306 may include C4 bumps.

As above, a semiconductor package according to embodiments of the present disclosure includes multiple semiconductor dies laterally spaced apart from one another, and includes a redistribution structure or an interposer for routing the semiconductor dies and for realizing interconnections between the semiconductor dies. The redistribution structure or an interconnection structure in the interposer includes multiple routing layers, which may include signal lines, ground lines, ground plane(s) and power plane(s). The signal lines in the routing layer that is closest to the semiconductor dies are configured to rout die I/Os of the semiconductor dies from a central region to a peripheral region of the redistribution structure or the interconnection structure. Therefore, pad portions (i.e., terminal portions) of the signal lines and ground lines in the routing layer next to the routing layer closest to the semiconductor dies can be disposed in the peripheral region of the redistribution structure or the interconnection structure. As a result, more area in the central region of the redistribution structure or the interconnection structure can be provided for line portions of these signal lines and ground lines. In other words, these signal lines and ground lines can be considered as having a larger routing area in the central region of the redistribution structure or the interconnection structure. In addition, since these signal lines and ground lines have larger routing area, spacing and/or line width of these signal lines and ground lines can be effectively increased. Consequently, these signal lines and ground lines can be less susceptible to stress induced during manufacturing process.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: semiconductor dies, laterally spaced apart from one another, and comprising die inputs/outputs (I/Os) at active sides of the semiconductor dies; and a redistribution structure, disposed at the active sides of the semiconductor dies and connected to the die I/Os, wherein the redistribution structure comprises a first routing layer and a second routing layer sequentially arranged along a direction away from the die I/Os, the first routing layer comprises a first ground plane and first signal lines, the first signal lines are located at where the first ground plane is discontinuous, the first signal lines respectively have two pad portions and a line portion extending between the two pad portions, one of the two pad portions of each first signal line is located within a central region of the redistribution structure, the other pad portion of each first signal line is located within a peripheral region of the redistribution structure, the second routing layer comprises second signal lines and first ground lines, the second signal lines are electrically connected to the first signal lines, the first ground lines are electrically connected to the first ground plane, the second signal lines and the first ground lines respectively have two pad portions and a line portion extending in between, the two pad portions of each of the second signal lines and the first ground lines are both located in the peripheral region of the redistribution structure, and the line portion of each of the second signal lines and the first ground lines passes through the central region of the redistribution structure.

In another aspect of the present disclosure, a semiconductor package is provided. The semiconductor package comprises: semiconductor dies, laterally spaced apart from one another, and comprising die inputs/outputs (I/Os) at active sides of the semiconductor dies; and a redistribution structure, disposed at the active sides of the semiconductor dies and connected to the die I/Os, wherein the redistribution structure comprises a first routing layer and a second routing layer sequentially arranged along a direction away from the die I/Os, the first routing layer comprises a ground plane and first signal lines, the first signal lines are laterally surrounded by and isolated from the first ground plane, the first signal lines connect to the die I/Os and rout the die I/Os from a central region to a peripheral region of the redistribution structure, the second routing layer comprises second signal lines and ground lines, the second signal lines are electrically connected to the first signal lines, the ground lines are electrically connected to the ground plane, the second signal lines and the ground lines respectively extend from a first location in the peripheral region to a second location in the peripheral region through the central region, and interconnection between adjacent ones of the semiconductor dies is established through the second signal lines.

In yet another aspect of the present disclosure, a semiconductor package is provided. The semiconductor package comprises: semiconductor dies, laterally spaced apart from one another, and comprising die inputs/outputs (I/Os) at active sides of the semiconductor dies; and an interposer, on which the die I/Os are attached, and comprising a substrate, through substrate vias penetrating through the substrate and an interconnection structure formed on the substrate, wherein the interconnection structure comprises a first routing layer and a second routing layer sequentially arranged along a direction away from the die I/Os, the first routing layer comprises a ground plane and first signal lines, the first signal lines are laterally surrounded by and isolated from the ground plane, the first signal lines respectively have two pad portions and a line portion extending in between, one of the two pad portions of each first signal line is located within a central region of the interconnection structure, the other pad portion of each first signal line is located within a peripheral region of the interconnection structure, the second routing layer comprises second signal lines and ground lines, the second signal lines are electrically connected to the first signal lines, the ground lines are electrically connected to the ground plane, the second signal lines and the ground lines respectively have two pad portions and a line portion extending in between, the two pad portions of each of the second signal lines and the ground lines are both located in the peripheral region of the interconnection structure, and the line portion of each of the second signal lines and the ground lines passes through the central region of the interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    semiconductor dies, laterally spaced apart from one another, and comprising die inputs/outputs (I/Os) at active sides of the semiconductor dies; and
    a redistribution structure, disposed at the active sides of the semiconductor dies and connected to the die I/Os, wherein the redistribution structure comprises a first routing layer and a second routing layer sequentially arranged along a direction away from the die I/Os,
    wherein the first routing layer comprises a first ground plane and first signal lines, the first signal lines are located at where the first ground plane is discontinuous, the first signal lines respectively have two pad portions and a line portion extending between the two pad portions, one of the two pad portions of each first signal line is located within a central region of the redistribution structure, the other pad portion of each first signal line is located within a peripheral region of the redistribution structure, and
    wherein the second routing layer comprises second signal lines and first ground lines, the second signal lines are electrically connected to the first signal lines, the first ground lines are electrically connected to the first ground plane, the second signal lines and the first ground lines respectively have two pad portions and a line portion extending in between, the two pad portions of each of the second signal lines and the first ground lines are both located in the peripheral region of the redistribution structure, and the line portion of each of the second signal lines and the first ground lines passes through the central region of the redistribution structure.

2. The semiconductor package according to claim 1, wherein the pad portions of the first signal lines within the central region of the redistribution structure are positioned in correspondence to the die I/Os of the semiconductor dies.

3. The semiconductor package according to claim 1, wherein the first signal lines are laterally surrounded by the first ground plane, and are isolated from the first ground plane.

4. The semiconductor package according to claim 1, wherein each of the first ground lines is arranged between two of the second signal lines.

5. The semiconductor package according to claim 1, wherein the line portions of the second signal lines are parallel with the line portions of the first ground lines.

6. The semiconductor package according to claim 1, wherein an interconnection between adjacent ones of the semiconductor dies is established though the second signal lines.

7. The semiconductor package according to claim 1, wherein the second signal lines and the first ground lines are overlapped with the first ground plane.

8. The semiconductor package according to claim 1, wherein the redistribution structure further comprises a third routing layer more distant from the die I/Os than the first and second routing layers, the third routing layer comprises third signal lines and second ground lines, each of the third signal lines and the second ground lines has two pad portions and a line portion extending in between, the two pad portions of each of the third signal lines and the second ground lines are located within the peripheral region, and the line portion of each of the third signal lines and the second ground lines passes through the central region.

9. The semiconductor package according to claim 8, wherein each of the second signal lines is overlapped with the first ground plane and one of the second ground lines, and is arranged between adjacent ones of the first ground lines.

10. The semiconductor package according to claim 8, wherein the redistribution structure further comprises a fourth routing layer more distant from the die I/Os than the first, second and third routing layers, the fourth routing layer comprises a second ground plane and a power plane laterally surrounded by the second ground plane and isolated from the second ground plane.

11. The semiconductor package according to claim 10, wherein each of the third signal lines is overlapped with one of the first ground lines and the second ground plane, and is arranged between adjacent ones of the second ground lines.

12. The semiconductor package according to claim 1, further comprises an encapsulant laterally encapsulating the semiconductor dies, and in contact with the redistribution structure.

13. The semiconductor package according to claim 1, wherein the die I/Os are conductive pillars, and the redistribution structure comprises a stack of polymer layers in which the first and second routing layers are formed.

14. A semiconductor package, comprising:
    semiconductor dies, laterally spaced apart from one another, and comprising die inputs/outputs (I/Os) at active sides of the semiconductor dies; and
    a redistribution structure, disposed at the active sides of the semiconductor dies and connected to the die I/Os, wherein the redistribution structure comprises a first routing layer and a second routing layer sequentially arranged along a direction away from the die I/Os, wherein the first routing layer comprises a ground plane and first signal lines, the first signal lines are laterally surrounded by and isolated from the first ground plane, a first terminal of each first signal line is positioned in correspondence with one of the die I/Os and located within a central region of the redistribution structure, and the first signal lines extending from the first terminals are bounded at second terminals arranged along a same lateral side of the redistribution structure, and wherein the second routing layer comprises second signal lines and ground lines each having two terminals arranged along the lateral side of the redistribution structure, the second signal lines each extend from the second terminal of one of the first signal lines to the second terminal of another one of the first signal lines through the central region of the redistribution structure, and the ground lines each extend between adjacent ones of the second signal lines.

15. The semiconductor package according to claim 14, further comprising electrical connectors, disposed at a surface of the redistribution structure facing away from the semiconductor dies.

16. The semiconductor package according to claim 15, further comprising a package substrate, on which the electrical connectors are attached.

17. The semiconductor package according to claim 16, wherein the package substrate is further attached onto a printed circuit board through additional electrical connectors.

18. A semiconductor package, comprising:
a first semiconductor die and a second semiconductor die, laterally spaced apart from each other and encapsulated by an encapsulant, wherein first die I/Os of the first semiconductor dies and second die I/Os of the second semiconductor die extend to a front side of the encapsulant;

a first routing layer, disposed at the front side of the encapsulant, and comprising a first ground plane and first signal lines extending in openings defined in the first ground plane, wherein the first signal lines extend from first terminals respectively positioned in correspondence with one of the first and second die I/Os and located within a central region of the first routing layer, and are bounded at second terminals arranged along a same lateral side of the first routing layer; and a second routing layer, disposed at a side of the first routing layer facing away from the encapsulant, and comprising second signal lines and first ground lines extending along and in parallel with the second signal lines, wherein the second signal lines respectively connect the second terminal of one of the first signal lines routed from one of the first die I/Os to the second terminal of another one of the first signal lines routed from one of the second die I/Os, and are each bounded at two terminals arranged along a same lateral side of the second routing layer while passing through a central region of the second routing layer.

19. The semiconductor package according to claim 18, further comprising:
a third routing layer, comprising third signal lines and second ground lines extending along and in parallel with the third signal lines, wherein each third signal line establishes a conduction path between one of the first die I/Os and one of the second die I/Os, and all terminals of the third signal lines and the second ground lines are arranged along the same edge of the third routing layer.

20. The semiconductor package according to claim 19, further comprising:
a fourth routing layer, comprising a second ground plane formed with an array of openings, and comprising a power plane laterally surrounded by the second ground plane.

* * * * *